(12) United States Patent
Kuechenmeister et al.

(10) Patent No.: US 7,569,937 B2
(45) Date of Patent: Aug. 4, 2009

(54) TECHNIQUE FOR FORMING A COPPER-BASED CONTACT LAYER WITHOUT A TERMINAL METAL

(75) Inventors: Frank Kuechenmeister, Dresden (DE); Matthias Lehr, Dresden (DE); Gotthard Jungnickel, Radeberg (DE)

(73) Assignee: Advanced Micro Devices, Inc., Austin, TX (US)

( * ) Notice: Subject to any disclaimer, the term of this patent is extended or adjusted under 35 U.S.C. 154(b) by 396 days.

(21) Appl. No.: 11/382,152

(22) Filed: May 8, 2006

(65) Prior Publication Data

US 2007/0023918 A1 Feb. 1, 2007

(30) Foreign Application Priority Data

Jul. 29, 2005 (DE) .................. 10 2005 035 771

(51) Int. Cl.
*H01L 23/48* (2006.01)

(52) U.S. Cl. ................ 257/762; 257/781; 257/E23.161; 438/687

(58) Field of Classification Search ................ 438/687; 257/762, 781, E23.161
See application file for complete search history.

(56) References Cited

U.S. PATENT DOCUMENTS

| 6,649,533 B1* | 11/2003 | Iacoponi .................. 438/719 |
| 2003/0073300 A1* | 4/2003 | Chen et al. ................ 438/613 |
| 2004/0157450 A1* | 8/2004 | Bojkov et al. ............. 438/689 |
| 2004/0182915 A1* | 9/2004 | Bachman et al. .......... 228/220 |
| 2005/0006759 A1 | 1/2005 | Huang ...................... 257/734 |
| 2006/0087039 A1* | 4/2006 | Cheng et al. .............. 257/750 |

FOREIGN PATENT DOCUMENTS

EP 1 321 982 A1 12/2002 ............ 23/485

* cited by examiner

*Primary Examiner*—Trung Dang
(74) *Attorney, Agent, or Firm*—Williams, Morgan & Amerson, P.C.

(57) ABSTRACT

By directly forming an underbump metallization layer on a copper-based contact region, the formation of any other terminal metals, such as aluminum and corresponding adhesion/barrier layers may be avoided. Consequently, the thermal and electrical behavior of the resulting bump structure may be improved, while process complexity may significantly be reduced.

6 Claims, 7 Drawing Sheets

TECHNIQUE FOR FORMING A COPPER-BASED CONTACT LAYER WITHOUT A TERMINAL METAL

BACKGROUND OF THE INVENTION

1. Field of the Invention

The present invention generally relates to the formation of integrated circuits, and, more particularly, to a process flow for forming a contact layer including bumps, wherein the contact layer is configured to provide copper-based contact areas connected to a lower-lying metallization layer for directly attaching an appropriately formed package or carrier substrate to a die carrying one or more integrated circuits.

2. Description of the Related Art

In manufacturing integrated circuits, it is usually necessary to package a chip and provide leads and terminals for connecting the chip circuitry with the periphery. In some packaging techniques, chips, chip packages or other appropriate units may be connected by means of solder balls, formed from so-called solder bumps, that are formed on a corresponding layer, which will be referred to herein as a contact layer, of at least one of the units, for instance on a dielectric passivation layer of the microelectronic chip. In order to connect the microelectronic chip with the corresponding carrier, the surfaces of two respective units to be connected, i.e., the microelectronic chip comprising, for instance, a plurality of integrated circuits, and a corresponding package, have formed thereon adequate pad arrangements to electrically connect the two units after reflowing the solder bumps provided at least on one of the units, for instance on the microelectronic chip. In other techniques, solder bumps may have to be formed that are to be connected to corresponding wires, or the solder bumps may be brought into contact with corresponding pad areas of another substrate acting as a heat sink. Consequently, it may be necessary to form a large number of solder bumps that may be distributed over the entire chip area, thereby providing, for example, the I/O capability as well as the desired low-capacitance arrangement required for high frequency applications of modern microelectronic chips that usually include complex circuitry, such as microprocessors, storage circuits and the like, and/or include a plurality of integrated circuits forming a complete complex circuit system.

In modern integrated circuits, highly conductive metals such as copper and alloys thereof, are used to accommodate the high current densities encountered during the operation of the devices. Consequently, the metallization layers may comprise metal lines and vias formed from copper or copper alloys, wherein the last metallization layer may provide contact areas for connecting to the solder bumps to be formed above the copper-based contact areas. The processing of copper in the subsequent process flow for forming the solder bumps, which is itself a highly complex manufacturing phase, may be performed on the basis of the well-established metal aluminum that has effectively been used for forming solder bump structures in complex aluminum-based microprocessors. For this purpose, an appropriate barrier and adhesion layer is formed on the copper-based contact area, followed by an aluminum layer. Subsequently, the contact layer including the solder bumps is formed on the basis of the aluminum-covered contact area.

In order to provide hundreds or thousands of mechanically well-fastened solder bumps on corresponding pads, the attachment procedure of the solder bumps requires a careful design since the entire device may be rendered useless upon failure of only one of the solder bumps. For this reason, one or more carefully chosen layers are generally placed between the solder bumps and the underlying substrate or wafer including the aluminum-covered contact areas. In addition to the important role these interfacial layers, herein also referred to as underbump metallization layers, may play in endowing a sufficient mechanical adhesion of the solder bump to the underlying contact area and the surrounding passivation material, the underbump metallization has to meet further requirements with respect to diffusion characteristics and current conductivity. Regarding the former issue, the underbump metallization layer has to provide an adequate diffusion barrier to prevent the solder material, frequently a mixture of lead (Pb) and tin (Sn), from attacking the chip's underlying metallization layers and thereby destroying or negatively affecting their functionality. Moreover, migration of solder material, such as lead, to other sensitive device areas, for instance into the dielectric, where a radioactive decay in lead may also significantly affect the device performance, has to be effectively suppressed by the underbump metallization. Regarding current conductivity, the underbump metallization, which serves as an interconnect between the solder bump and the underlying metallization layer of the chip, has to exhibit a thickness and a specific resistance that does not inappropriately increase the overall resistance of the metallization pad/solder bump system. In addition, the underbump metallization will serve as a current distribution layer during electroplating of the solder bump material. Electroplating is presently the preferred deposition technique, since physical vapor deposition of solder bump material, which is also used in the art, requires a complex mask technology in order to avoid any misalignments due to thermal expansion of the mask while it is contacted by the hot metal vapors. Moreover, it is extremely difficult to remove the metal mask after completion of the deposition process without damaging the solder pads, particularly when large wafers are processed or the pitch between adjacent solder pads decreases.

Although a mask is also used in the electroplating deposition method, this technique differs from the evaporation method in that the mask is created using photolithography to thereby avoid the above-identified problems caused by physical vapor deposition techniques. After the formation of the solder bumps, the underbump metallization has to be patterned to electrically insulate the individual solder bumps from each other.

With reference to FIGS. 1a-1c, a typical conventional process flow will now be described to explain difficulties involved in forming solder bumps of copper-based semiconductor devices in more detail.

FIG. 1a schematically shows a cross-sectional view of a conventional semiconductor device 100 in an advanced manufacturing stage. The semiconductor device 100 comprises a substrate 101, which may have formed therein circuit elements and other microstructural features that are, for convenience, not shown in FIG. 1a. Moreover, the device 100 comprises one or more metallization layers including copper-based metal lines and vias, wherein, for convenience, the last metallization layer 107 is shown, which may comprise a dielectric material and formed therein a metal region 102 that is substantially comprised of copper or a copper alloy. The metallization layer 107 is covered by a corresponding passivation layer 103, except for at least a certain portion of the metal region 102. The passivation layer 103 may be comprised of any suitable dielectric material, such as silicon dioxide and the like. Formed above the copper-based metal region 102 is a barrier/adhesion layer 104, which may be comprised of tantalum, tantalum nitride, titanium, titanium nitride, tantalum nitride or compositions thereof, and the like, wherein the barrier/adhesion layer 104 provides the required diffusion blocking characteristics as well as the corresponding adhesion between an overlying aluminum layer 105 and the copper-based metal region 102. The aluminum layer 105 in combination with the adhesion/barrier layer 104 may be referred to as a terminal metal. The aluminum layer 105 thus defines in combination with the patterned passivation layer 103, the barrier/adhesion layer 104 and the underlying copper-based metal region 102, a contact region 105a, above which a solder bump is to be formed. Moreover, a corresponding resist mask 106 is formed on the device 100 to protect the contact region 105a while exposing the residue of the layer 105 to an etch ambient 108 that typically includes chlorine-based chemicals for efficiently removing aluminum.

The semiconductor device 100 as shown in FIG. 1a may be formed by the following processes. First, the substrate 101 and any circuit elements contained therein may be manufactured on the basis of well-established process techniques, wherein, in sophisticated applications, circuit elements having critical dimensions as small as approximately 50 nm and even less may be formed, followed by the formation of the one or more metallization layers 107 including copper-based metal lines and vias, wherein typically low-k dielectric materials are used for embedding at least the metal lines. Next, the passivation layer 103 may be formed on the last metallization layer 107 by any appropriate deposition technique, such as plasma enhanced chemical vapor deposition (PECVD) and the like. Thereafter, a standard photolithography process is performed to form a photoresist mask (not shown) having a shape and dimension that substantially determines the shape and dimension of the contact region 105a and thus substantially determines, in combination with the material characteristics of the layers 105 and 104, the drive current capability of the finally obtained electrical connection between the metallization layer 107, i.e., the copper-based metal region 102, and a solder bump to be formed above the contact region 105a. Subsequently, the passivation layer 103 may be opened on the basis of the resist mask, which may then be removed by well-established resist removal processes that may include appropriate cleaning steps, as required.

Thereafter, the barrier/adhesion layer 104 may be deposited, for instance, by sputter deposition using well-established process recipes for tantalum, tantalum nitride, titanium, titanium nitride, or other similar metals and compounds thereof as are typically used in combination with copper metallizations to effectively reduce copper diffusion and enhance adhesion of the overlying aluminum layer 105. Next, the aluminum layer may be deposited, for instance by sputter deposition, chemical vapor deposition and the like, followed by a standard photolithography process for forming the resist mask 106.

Next, the reactive etch ambient 108 is established, which may require a complex chlorine-based etch chemistry, wherein the process parameters may require an accurate process control to substantially prevent undue yield loss. The etch process 108 may also comprise a separate etch step for etching through the barrier/adhesion layer 104 and may also include a wet strip process for removing any corrosive etch residues generated during the complex aluminum etch step.

FIG. 1b schematically shows the semiconductor device 100 in a further advanced manufacturing stage, in which a further passivation layer 109, which is also referred to as a last passivation layer, is formed above the contact region 105a, followed by a resist mask 110, which is configured to act as an etch mask in a subsequent etch process for opening the last passivation layer 109. The layer 109 may be formed on the basis of well-established spin-on techniques or other deposition methods, while the resist mask 110 may be formed on the basis of established photolithography techniques. Based on the resist mask 110, the passivation layer 109, typically comprised of polyimide, may be etched to expose at least a portion of the contact region 105a.

According to alternative approaches, the aluminum layer 105 and the barrier/adhesion layer 104 may be deposited on the metallization layer 107 prior to the formation of the passivation layer 103. Thereafter, the passivation layer 103 may be patterned, followed by the highly complex aluminum etch process 108, including any etch and cleaning processes for also patterning the barrier/adhesion layer 104. Thereafter, the last passivation layer 109 may be deposited and further processing may be continued, as is also described above with reference to FIG. 1b.

FIG. 1c schematically shows the semiconductor device 100 in a further advanced manufacturing stage. Here, the device 100 comprises an underbump metallization layer 111, which is shown in this example as comprising at least a first underbump metallization layer 111a and a second layer 111b, which are formed on the patterned last passivation layer 109 and on the contact region 105a. The underbump metallization layer 111 may be comprised of any appropriate layer combination so as to provide the required electrical, thermal and mechanical characteristics, as well as reducing or avoiding a diffusion of material of an overlying solder bump 112 into lower-lying device regions. Moreover, a resist mask 113 is formed which comprises an opening that substantially defines the shape and lateral dimensions of the solder bump 112.

Typically, the device 100 as shown in FIG. 1c may be formed by the following processes. First, the underbump metallization layer 111, for instance the layer 111b, may be formed by sputter deposition for forming a titanium tungsten layer (TiW), since this material composition is frequently used in view of its well-approved diffusion blocking and adhesion characteristics. Thereafter, further sub-layers of the underbump metallization layer 111 may be formed, such as the layer 111a, which may be provided in the form of a chromium/copper layer, which may be followed by a further substantially pure copper layer. The layer(s) 111a may be formed by sputter deposition in accordance with well-established recipes. Next, a further photolithography process is performed in order to form the resist mask 113, thereby providing a deposition mask for the subsequent electroplating process for the deposition of the solder bump 112. Thereafter, the resist mask 113 may be removed and the underbump metallization layer 111 may be patterned while using the solder bump 112 as an etch mask, thereby providing electrically insulated solder bumps 112. Depending on process requirements, the solder bumps 112 may be reflowed to create rounded solder balls (not shown) which may then be used for contacting an appropriate carrier substrate.

As is evident from the process flow described with reference to FIGS. 1a-1c, a highly complex process flow is required for providing the contact region 105a to enable the formation of the bump structure including the solder bump 112 and the underlying underbump metallization layer 111. However, even though the highly conductive copper is used for the metal region 102, the finally achieved current drive capability of the bump structure is significantly affected by the characteristics of the contact region 105a, i.e., by the aluminum layer 105 and the barrier/adhesion layer 104. Consequently, in the conventional procedure, a highly complex process flow, including the complex aluminum etch sequence, is involved while only resulting in a moderate electrical performance of the resulting bump structure. This situation may even become worse as aluminum pitting and also delamination of the polyimide layer 109 may occur, which may especially be caused by open copper areas, i.e., by areas similar to the region 102, that are referred to as open areas, typically provided at the die region to act as a die border, or in scribe lanes of the wafer when these scribe lanes are provided on the front side. In these open areas, the passivation layer 109 may not be provided, thereby promoting a delamination of the polyimide layer 109 at any interfaces between open areas and regular die regions. Thus, aluminum pitting and/or polyimide delamination may significantly contribute to yield loss in the above-described manufacturing sequence.

In view of the situation described above, a need exists for an improved technique that enables formation of a bump structure connected to copper-based metal regions, while avoiding one or more of the problems identified above or at least reducing the effects thereof.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of a bump structure including an underbump metallization layer and a solder bump or any other adhesive material bumps directly on a copper-based metal region, thereby avoiding highly complex barrier/adhesion and aluminum deposition and patterning processes. Thus, compared to conventional process strategies, the manufacturing sequence may be designed more efficiently, thereby reducing manufacturing costs, while at the same time providing enhanced performance with respect to the electrical, mechanical and thermal characteristics of the resulting bump structure.

According to one illustrative embodiment of the present invention, a semiconductor device comprises a metallization layer comprising a copper-based contact region that is laterally bordered by a passivation layer and that has a copper-containing contact surface. The semiconductor device further comprises a last passivation layer formed above the passivation layer and exposing at least a portion of the copper-containing contact surface. An underbump metallization layer is formed on the copper-containing contact surface and a portion of the last passivation layer. Finally, the semiconductor device comprises a solder bump formed on the underbump metallization layer.

In accordance with another illustrative embodiment of the present invention, a method comprises forming an underbump metallization layer on an exposed copper-containing surface of a contact region of a metallization layer. Moreover, a bump is formed on the underbump metallization layer above the copper-containing surface and the underbump metallization layer is patterned in the presence of the bump.

BRIEF DESCRIPTION OF THE DRAWINGS

The invention may be understood by reference to the following description taken in conjunction with the accompanying drawings, in which like reference numerals identify like elements, and in which.

Figure 1A:
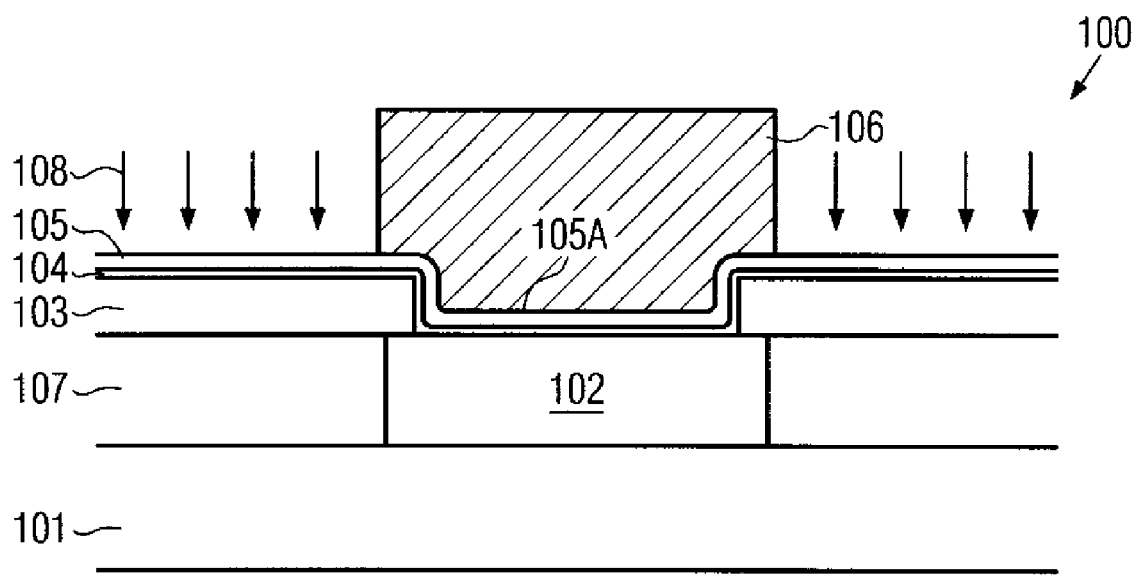
FIGS. 1a-1c schematically show cross-sectional views of a conventional semiconductor device during the formation of a bump structure above a copper-based metal region of a last metallization layer.
Figure 1B:
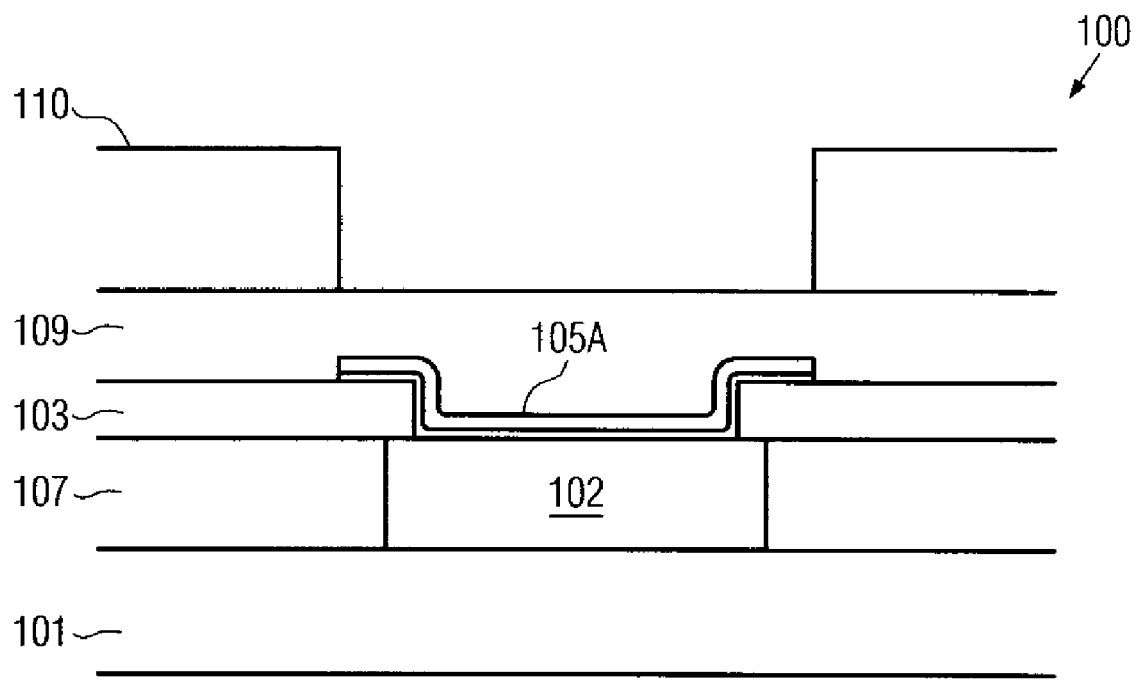
Figure 1C:
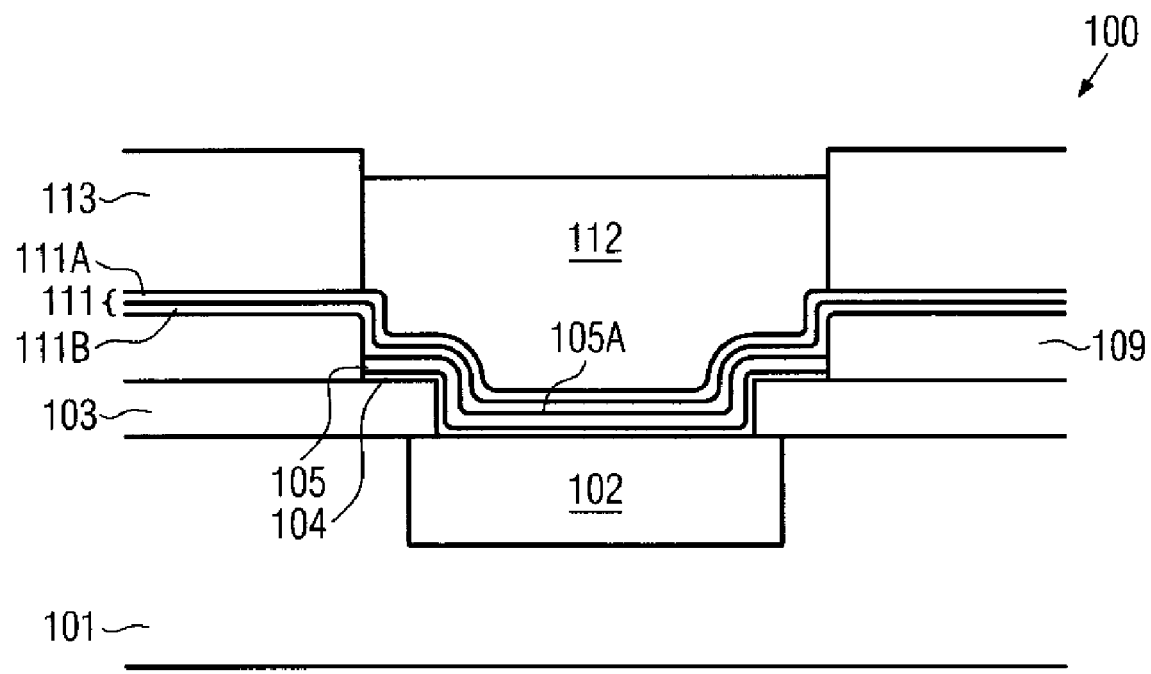

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention contemplates an improved technique for forming a bump structure, in which the performance of a copper-based metallization may be enhanced by omitting the formation of a terminal metal layer, such as a barrier/adhesion layer followed by an aluminum layer, on top of a copper-containing metal region by appropriately adapting the process flow for forming the final metallization layer and the process flow for forming a bump structure including a final passivation layer. By avoiding the deposition of, for instance, a terminal aluminum layer, generally the complexity of the overall process flow may significantly be reduced, thereby saving on production costs, while at the same time the electrical and/or mechanical and/or thermal characteristics of the resulting bump structure may be improved, or for a given performance of the bump structure the dimensions of the bump structure may correspondingly be reduced compared to a conventional semiconductor device. For example, a semiconductor device having a bump structure of the same dimensions as a conventional device may have a significantly improved current drive capability and may also provide enhanced heat dissipation due to the enhanced thermal and electrical conductivity of the resulting bump structure achieved by the omission of the additional and less conductive terminal metal layer.

Figure 2A:
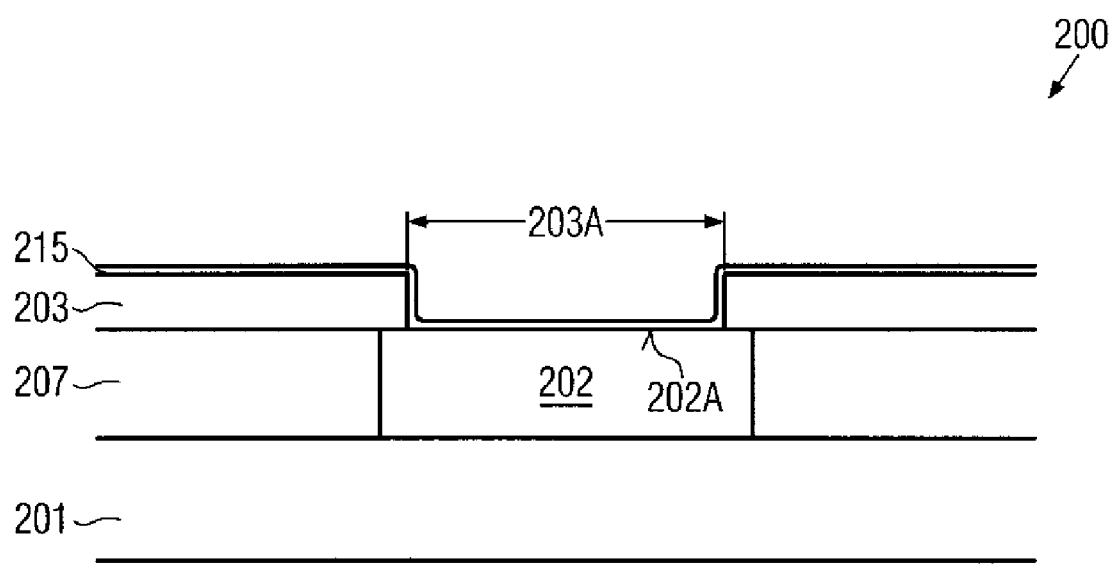
FIGS. 2a-2f schematically show cross-sectional views of a semiconductor device during the formation of a bump structure directly on a copper-containing surface in accordance with illustrative embodiments of the present invention.

With reference to FIGS. 2a-2f and 3a-3d, further illustrative embodiments of the present invention will now be described in more detail. FIG. 2a schematically shows a cross-sectional view of a semiconductor device 200 in an advanced manufacturing stage. The device 200 comprises a substrate 201, which may represent any appropriate substrate for the formation of integrated circuits, such as a bulk silicon substrate, a silicon-on-insulator (SOI) substrate, a glass substrate having formed thereon any appropriate semiconductor layer for forming circuit elements, or any other compound semiconductor material, such as II-VI and/or III-V semiconductors, and the like. Thus, a plurality of circuit elements (not shown), possibly in combination with other microstructural features, such as mechanical and optical elements, and the like, may be formed in and on the substrate 201.

Formed above the substrate 201 are one or more metallization layers 207, wherein for convenience the metallization layer 207 may represent the very last layer, comprising an appropriate dielectric material, such as silicon dioxide, silicon nitride, fluorine-doped silicon oxide, any low-k dielectric materials having a relative permittivity of 3.0 or less, or any combination thereof. Moreover, the metallization layer 207 may comprise a copper-based contact region 202, that is, a metal region that contains a significant portion of copper so as to provide superior thermal and electrical conductivity. It should be appreciated that the contact region 202 may include other metals or conductive materials, for instance any barrier/adhesion layers formed at an interface to the surrounding dielectric material of the metallization layer 207. The contact region 202 comprises a copper-containing contact surface 202a on which a bump structure is directly to be formed to provide enhanced thermal and electrical conductivity between the bump structure still to be formed and the metallization layer 207.

The metallization layer 207 may be covered by a passivation layer 203, except for the copper-containing surface 202a, wherein the passivation layer 203 may be comprised of any appropriate dielectric material, such as silicon dioxide, silicon nitride, silicon carbide, nitrogen-enriched silicon carbide, a low-k dielectric material, and appropriate combinations of these materials. For example, the passivation layer 203 may be formed of two or more sub-layers, wherein the lowest sub-layer may provide a diffusion blocking effect to substantially suppress any out-diffusion of copper into neighboring device regions. Moreover, the device 200 may comprise a copper protection layer 215, which in one illustrative embodiment may be formed on the passivation layer 203 and on the copper-containing surface 202a. The copper protection layer 215 may be comprised of any appropriate dielectric material, such as silicon nitride, silicon carbide, nitrogen-enriched silicon carbide and the like, and substantially protects the surface 202a during further processing and handling of the semiconductor device 200. The copper protection layer 215 may have a thickness in the range of approximately 5-50 nm, depending on process requirements.

A typical process flow for forming the semiconductor device 200 as shown in FIG. 2a may comprise the following processes. After the formation of any circuit elements and possibly of other microstructural features in and on the substrate 201 in accordance with predefined process recipes and design rules, the one or more metallization layers 207 may be formed on the basis of well-established damascene techniques for forming copper-based metal lines and vias. During the formation of the metallization layers 207, the copper-based contact region 202 having the surface 202a may also be formed. Thereafter, the passivation layer 203 may be formed by any appropriate deposition technique, such as plasma enhanced chemical vapor deposition (PECVD) in order to reliably cover the metallization layer 207. As previously explained, the passivation layer 203 may comprise a material that substantially suppresses an out-diffusion of copper atoms into neighboring device regions. Thereafter, the passivation layer 203 may be patterned on the basis of well-established photolithography and etch techniques, wherein the dimensions of an opening 203a for exposing the surface 202a may be selected in accordance with device and process requirements. As previously discussed, due to the superior thermal and electrical conductivity of the bump structure still to be formed, the dimension 203a may be selected less than in conventional devices having a comparable thermal and electrical conductivity. Consequently, significant material savings may be achieved in subsequent processes for the formation of solder bumps and the like. On the other hand, for a predefined dimension 203a, the finally achieved thermal and electrical conductivity may significantly be enhanced compared to a conventional device. After the patterning of the passivation layer 203, the copper protection layer 215 may be formed on the basis of well-established deposition recipes, such as PECVD and the like, wherein process parameters may be selected to obtain the desired material composition and layer thickness.

Figure 2B:
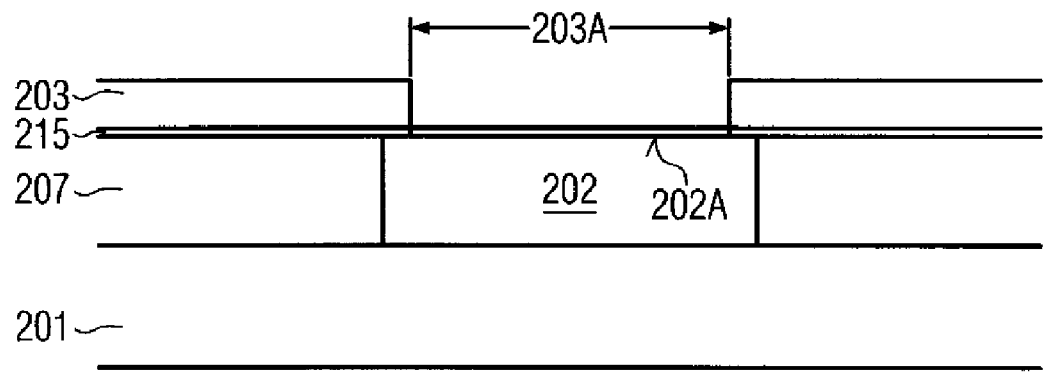
Figure 2C:
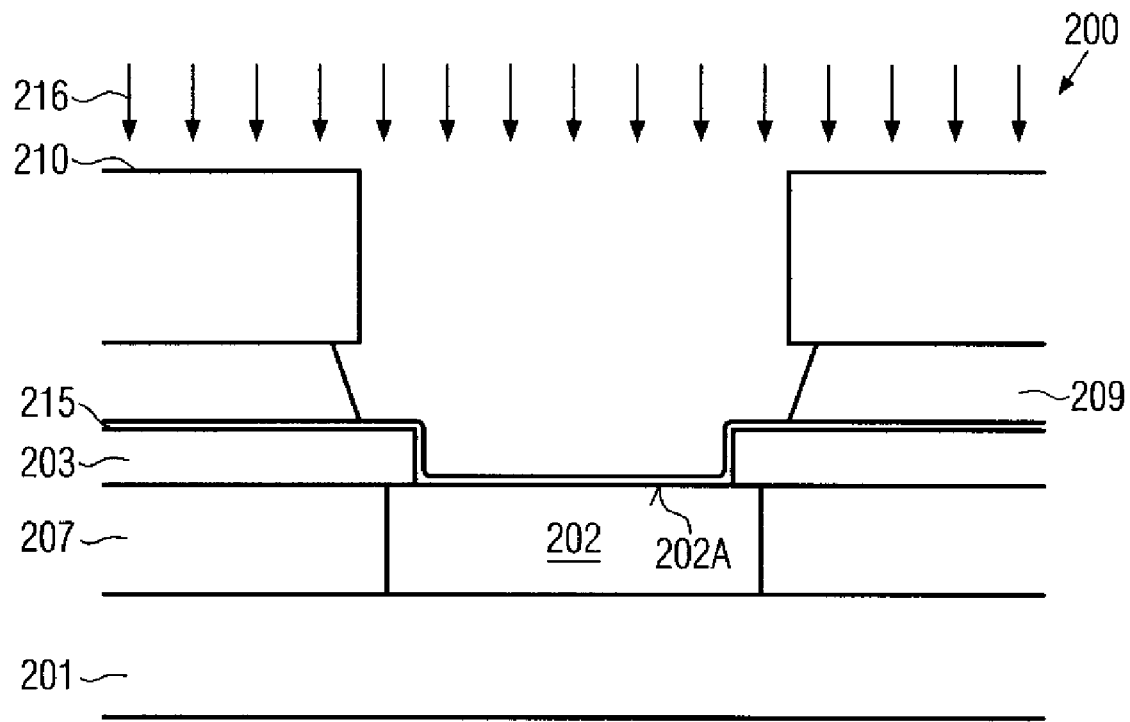

FIG. 2c schematically shows the semiconductor device 200 in a further advanced manufacturing stage, wherein, for convenience, the device 200 is shown on the basis of the device 200 of FIG. 2a, while it should be appreciated that the further manufacturing sequence for the device 200 may also be continued on the basis of the device 200 as shown in FIG. 2b. The device 200 comprises a further passivation layer 209, which is also referred to as the last passivation layer and which is comprised of any appropriate material, such as polyimide and the like. The last passivation layer 209 in combination with the passivation layer 203 and the copper protection layer 215 are intended to laterally border, at least partially, the bump structure to be formed on the surface 202a. To this end, the last passivation layer 209 is patterned by means of a photolithography and etch technique, wherein a corresponding resist mask 210 has been formed by lithography, followed by an appropriate well-established etch process 216. The etch process 216 may be based on well-established isotropic etch techniques as are also used in conventional process flows. Moreover, due to the provision of the copper protection layer 215, the integrity of the surface 202a is substantially maintained throughout the etch process 216 and also during the deposition of the last passivation layer 209, which may be accomplished by well-established spin-on techniques, plasma-based deposition techniques and the like.

Figure 2D:
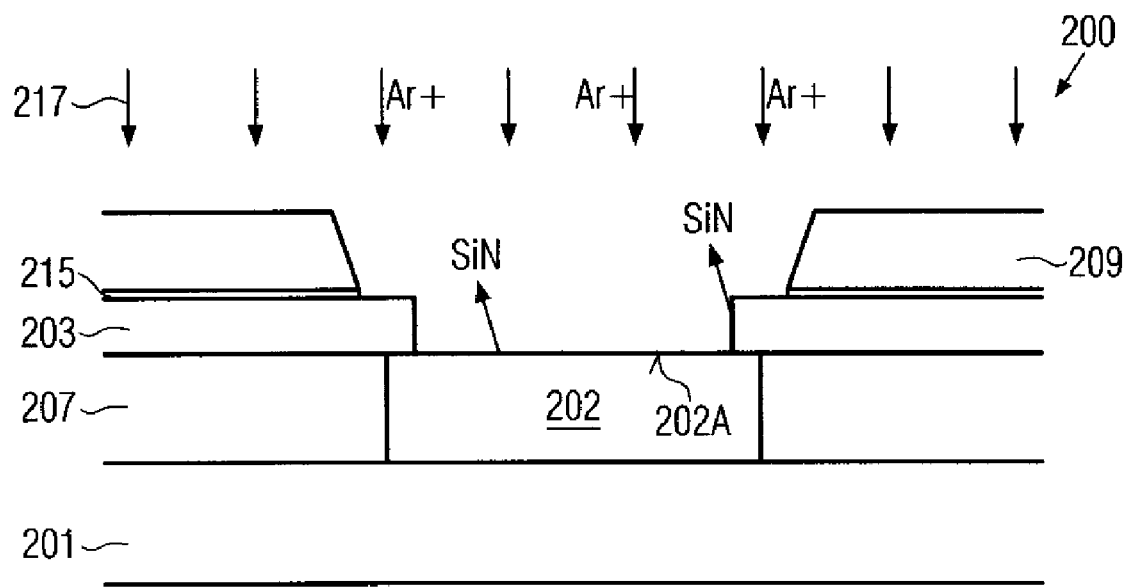

FIG. 2d schematically shows the semiconductor device 200 in a further advanced manufacturing stage, in which the resist mask 210 is removed, which may have been accomplished by well-established resist strip or resist-ash processes followed by any cleaning processes, wherein the surface 202a is still reliably covered by the copper protection layer 215. Moreover, the device 200 is shown to be subjected to an appropriately designed surface treatment process 217 to expose the surface 202a. In one illustrative embodiment, the process 217 is designed as a pre-cleaning process as typically used prior to sputter-depositing any appropriate metal onto an exposed copper surface. Thus, the process 217 may be designed as a pre-sputter process with appropriately selected parameters to provide a sufficient bombardment of an inert species, such as argon and the like, in order to remove the material of the copper protection layer 215, which may for instance be comprised of silicon nitride. Consequently, during the process 217, the surface 202a may increasingly be exposed, while at the same time the ongoing ion bombardment substantially suppresses the formation of non-desired discolorations and oxidized portions on the surface 202a. In one particular embodiment, the process parameters, i.e., the supply of precursor materials, of the process 217 for removing the exposed portion of the copper protection layer 215, may be modified in situ to subsequently establish a sputter deposition atmosphere in order to form a conductive underbump metallization layer on exposed portions of the last passivation layer 209, the copper protection layer 215, the passivation layer 203 and the exposed copper-containing surface 202a.

Figure 2E:
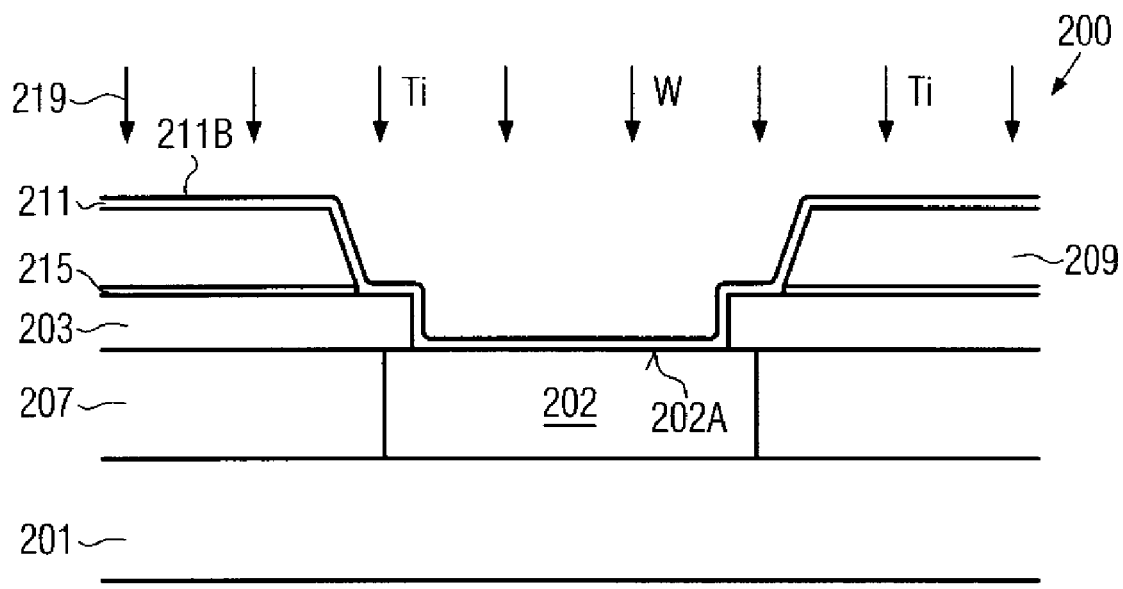

FIG. 2e schematically shows the semiconductor device 200 during the formation of an underbump metallization layer 211, or at least a sub-layer 211b thereof, by means of a sputter deposition process 219. In illustrative embodiments, the sputter deposition process 219 may be designed to form any appropriate metal or metal compound, such as titanium tungsten, tantalum, titanium, titanium nitride, tantalum nitride, tungsten, tungsten silicide, titanium silicide, tantalum silicide, or nitrogen-enriched tungsten, tantalum and titanium silicides, and the like. In these embodiments, the process 217 (FIG. 2d) may have been performed in situ as a pre-cleaning process, wherein, after the removal of the copper protection layer 215 from the surface 202a, the ratio of argon ions and metal ions and other precursor materials, such as nitrogen and silicon, if required, may be changed in such a way that an efficient deposition of the layer 211b may be achieved. Consequently, the underbump metallization layer 211, i.e., the first sub-layer 211b thereof, is directly deposited on the exposed surface 202a without requiring the provision of any intermediate terminal metal as is used in the conventional technique. After the formation of the sub-layer 211b, one or more further sub-layers of any appropriate material composition may be deposited, for instance by sputter deposition, electrochemical deposition, chemical vapor deposition (CVD), and the like, to complete the underbump metallization layer 211 in accordance with device requirements. For example, chromium and copper are frequently used for further underbump metallization layers to form a layer stack comprising, in addition to the layer 211b, a further chromium-copper layer followed by a substantially pure copper layer. It should be appreciated however, that any other layer sequence and material composition may be provided on the layer 211b.

Figure 2F:
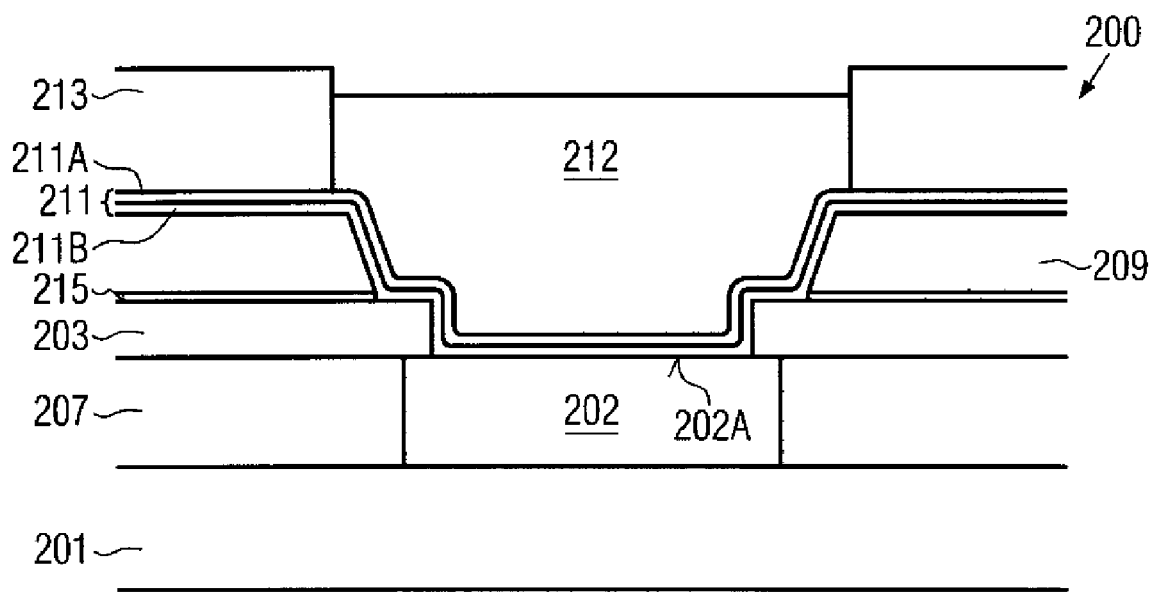

FIG. 2f schematically shows the device 200 in a further advanced manufacturing stage. Here, at least one further sub-layer 211a is formed on the layer 211b to complete the underbump metallization layer 211. Moreover, a resist mask 213 is provided that defines the lateral dimensions of a solder bump 212 formed within an opening of the resist mask 213. The solder bump 212 may be comprised of any appropriate material composition, such as lead and tin or any other components according to device requirements. As explained above, the layer or layers 211a may be formed by any appropriate deposition technique, followed by well-established photolithography techniques for forming and patterning the resist mask 213. Thereafter, the solder bump 212 may be formed by electroplating using the underbump metallization layer 211 as a current distribution layer, while the resist mask 213 defines the lateral dimensions of the solder bump 212. Thus, the device 200 comprises a bump structure comprised of the solder bump 212 and the underbump metallization layer 211, which is directly formed on the contact region 202, i.e., on the copper-containing surface 202a, thereby significantly improving the thermal and electrical conductivity between the contact region 202 and the solder bump 212.

Thereafter, the further manufacturing process may be resumed by removing the resist mask 213, based on well-established resist removal techniques and thereafter the underbump metallization layer 211 may be patterned in the presence of the solder bump 212 to form electrically insulated solder bumps 212. The patterning process for the underbump metallization layer 211 may include wet chemical and/or electrochemical and/or plasma-based etch techniques. Thereafter, the solder bump 212 may be formed into a solder ball by appropriately reflowing the solder material. In other examples, the solder bumps 212 may be used for contacting an appropriate carrier substrate without a previous reflow process.

Figure 3A:
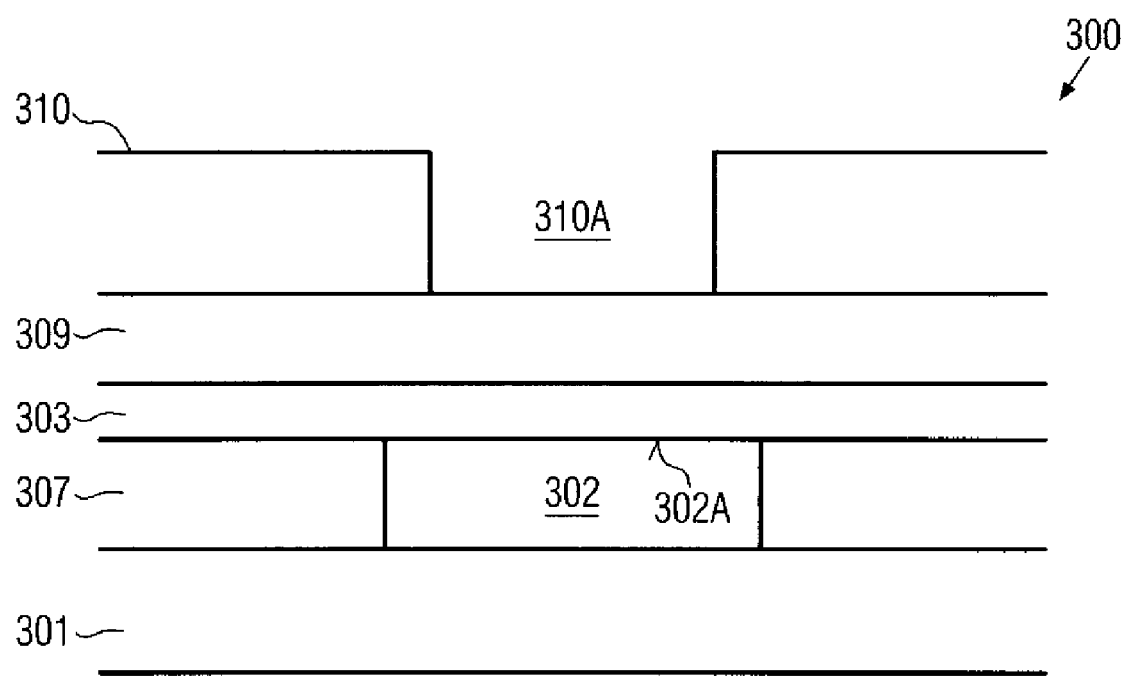
FIGS. 3a-3d schematically show cross-sectional views of a semiconductor device receiving a bump structure in accordance with still further illustrative embodiments of the present invention.

With reference to FIGS. 3a-3d, further illustrative embodiments of the present invention will now be described in more detail. FIG. 3a schematically shows a semiconductor device 300 comprising a substrate 301 above which is formed one or more metallization layers 307. The metallization layer 307 may comprise an appropriate dielectric material and a copper-based contact region 302 having a copper-containing surface 302a. With respect to the substrate 301 and further characteristics of the metallization layer 307, the same criteria apply as previously explained with reference to the semiconductor device 200. Moreover, the device 300 comprises a passivation layer 303 formed on the metallization layer 307 to cover any dielectric and metallic material of the layer 307. Above the passivation layer 303 is formed a further passivation layer 309, which is also referred to as last passivation layer, which will serve the same purpose as the passivation layers 109 and 209 explained with reference to FIGS. 1b, 1c and 2c-2f. A resist mask 310 is formed above the last passivation layer 309 and comprises an opening 310a having dimensions in accordance with design requirements so as to finally expose a portion of the surface 302a as required by the design rules.

The semiconductor device 300 as shown in FIG. 3a may be formed in accordance with the following process sequence. After the formation of any circuit elements and other microstructural features in and on the substrate 301 and after the completion of the one or more metallization layers 307 comprising the contact region 302, which may be accomplished by substantially the same processes as previously described with reference to the semiconductor device 200 and 100, the passivation layer 303 may be formed by any appropriate deposition technique, such as PECVD, spin-on techniques and the like. Regarding the material composition of the passivation layer 303, the same criteria apply as previously described with reference to the passivation layers 103 and 203. Thereafter, the last passivation layer 309 may be deposited in accordance with well-established techniques and subsequently a photolithography process is performed in order to provide the resist mask 310. As explained above, the lithography mask (not shown) used for the formation of the resist mask 310 may be designed to provide the opening 310a in accordance with design requirements selected to finally expose a desired portion of the surface 302a. In one illustrative embodiment, the resist mask 310 may be designed to act as an etch mask for commonly patterning the last passivation layer 309 and the passivation layer 303 in a common etch process. Thus, a thickness of the resist mask 310 may correspondingly be designed such that the required etch resistance for reliably patterning both passivation layers 303, 309 is ensured.

In a further illustrative embodiment, the last passivation layer 309 is provided with an increased thickness compared to a target thickness in accordance with the device specifications, thereby taking into consideration a material removal during an etch process for patterning the passivation layer 303, once the last passivation layer 309 has been patterned on the basis of the resist mask 310 which may have been removed after completion of the patterning process for the layer 309. Since any removal rates for dielectric materials for a plurality of isotropic and anisotropic etch chemicals are well known or may be established on the basis of correspondingly designed test runs, the corresponding material loss of the passivation layer 309 may readily be determined in advance and thus the deposition process for forming the layer 309 may correspondingly be redesigned to provide an extra thickness for the subsequent patterning of the passivation layer 303.

Figure 3B:
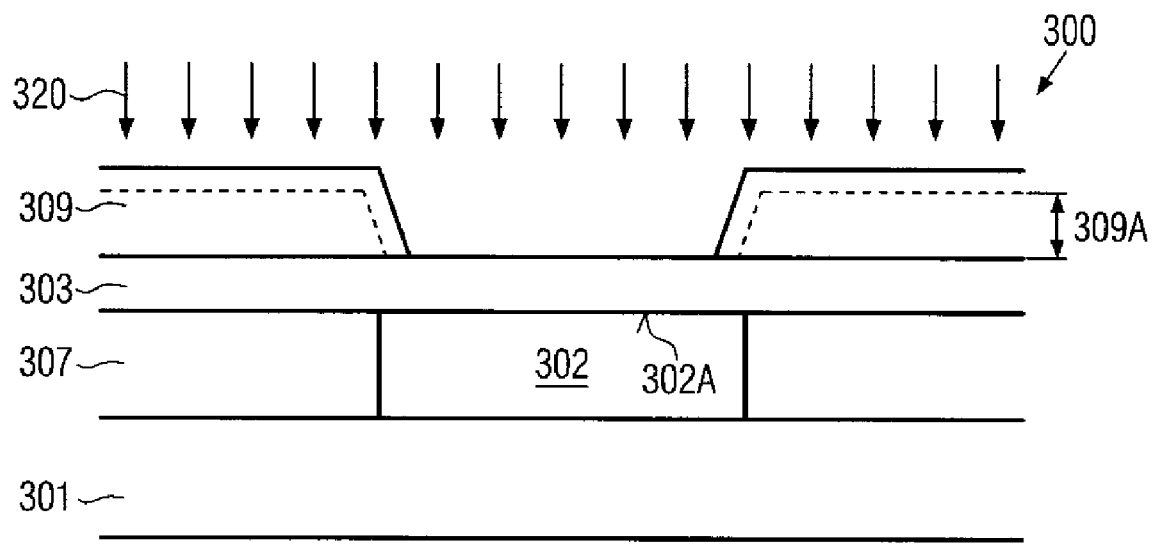

FIG. 3b schematically shows the semiconductor device 300 after the completion of patterning the last passivation layer 309 by using the resist mask 310, which is already removed in FIG. 3b. Moreover, a design target thickness 309a is indicated as dashed lines, wherein a difference in thickness between the layer 309 and the target thickness 309a substantially corresponds to a material loss that is expected in a subsequent etch process 320 for patterning the passivation layer 303. Corresponding etch recipes for the etch process 320 are well-established in the art and may be used in this case wherein, depending on the material composition of the last passivation layer 309 and the passivation layer 303, a similar or a different etch rate for the two materials may be obtained.

Figure 3C:
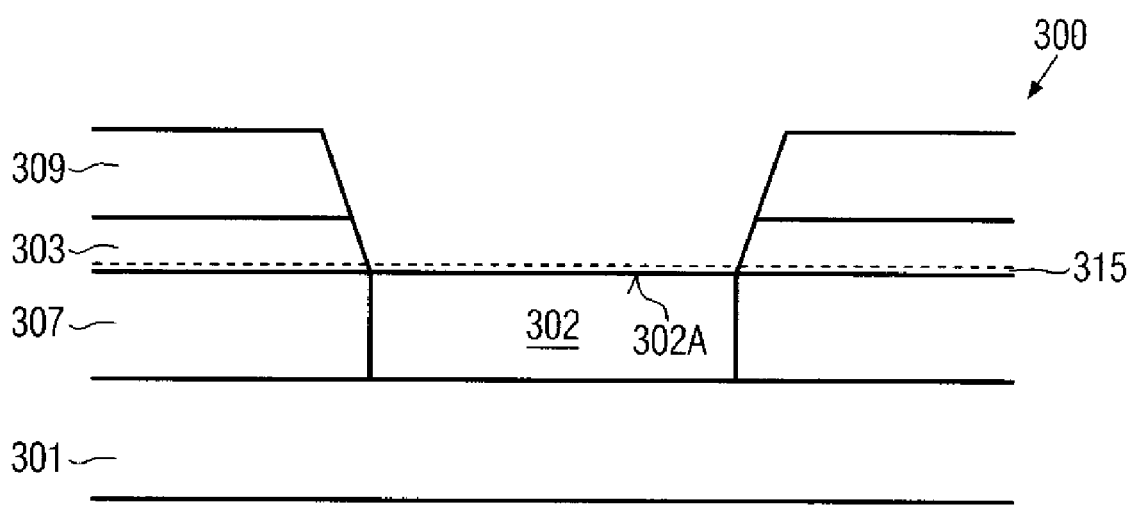

FIG. 3c schematically shows the semiconductor device 300 after the completion of the patterning process 320. Consequently, the surface 302a or at least a portion thereof, depending on the design criteria, is exposed so that the device 300 may now be prepared for receiving an underbump metallization layer directly on the exposed surface 302a. In still other embodiments, as indicated by the dashed line, a copper protection layer 315 may have been formed prior to the deposition of the passivation layer 303, wherein the layer 315 may act as an etch stop layer during the patterning process 320, thereby passivating the surface 302a during the etch process 320 and the subsequent handling of the device 300. For instance, the copper protection layer 315 may be comprised of silicon nitride, silicon carbide, nitrogen-enriched silicon carbide and the like, and may have a thickness of approximately 5-50 nm, so that the exposed portion of the layer 315 may readily be removed during a pre-cleaning phase of a subsequent sputter deposition process for forming at least one of the sub-layers of an underbump metallization layer to be formed on the surface 302a. For this purpose, a similar process technique may be applied as described with reference to FIGS. 2d and 2e and the processes 217 and 219. Thus, prior to the actual deposition of a first sub-layer, the copper protection layer 315 may be efficiently removed. In the embodiments in which the copper protection layer 315 is not provided, a typical pre-cleaning phase prior to the actual sputter deposition process may be performed to remove discolorations and oxidized portions from the surface 302a. Thereafter, the actual deposition process, such as the process 219 (FIG. 2e) may be performed followed by any other deposition processes, if required, to form an underbump metallization layer directly on the surface 302a. Thereafter, the further processing may be continued similarly to the process scheme discussed above, that is, a bump material may be deposited on the basis of an electrochemical deposition process by using a correspondingly designed resist mask.

Figure 3D:
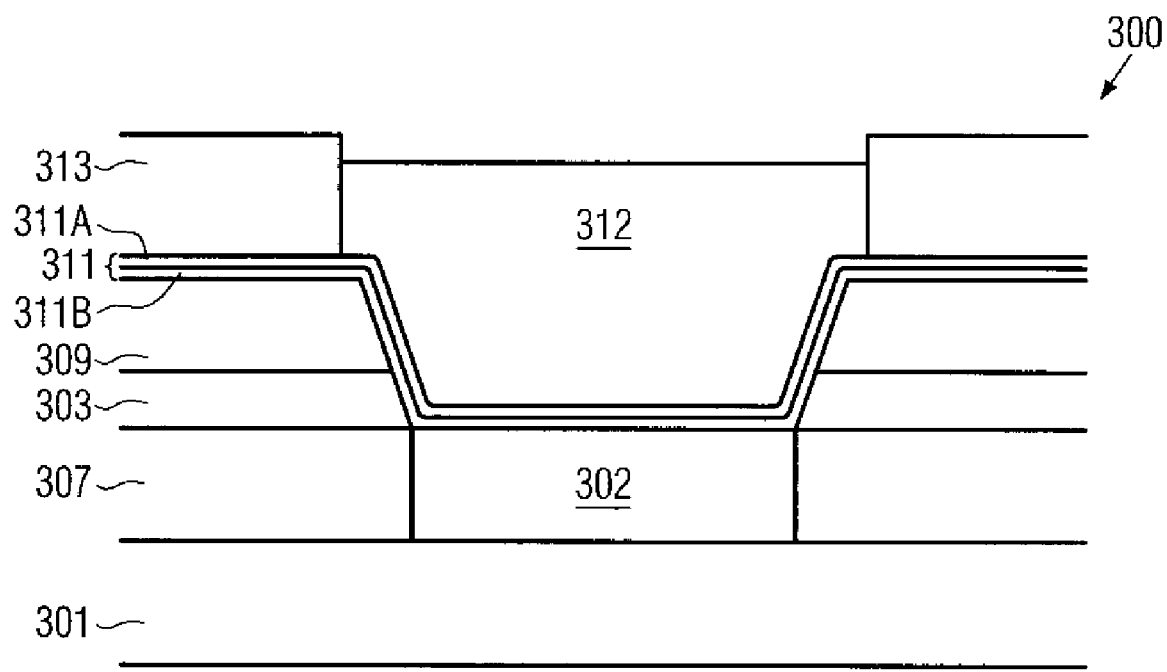

FIG. 3d schematically shows the semiconductor device 300 after the completion of the above-described process sequence. Thus, the device 300 comprises a resist mask 313 with a bump, such as a solder bump 312 formed therein, wherein the bump 312 is formed on an underbump metallization layer 311, which may comprise two or more sub-layers 311a, 311b providing the required adhesion/barrier/thermal and electrical characteristics. Thereafter, the further processing may be continued by patterning the underbump metallization layer 311, as is also explained with reference to FIG. 2f or the device 200.

As a result, the present invention provides an enhanced technique for forming a bump structure comprising a bump and an underbump metallization layer directly on a copper-based contact region so that the underbump metallization layer directly contacts a copper-containing surface of the contact region. In this respect, the term underbump metallization layer is to be understood as a layer that not only provides the required thermal, electrical, mechanical characteristics to obtain a good adhesion and performance of a bump formed above the copper-based contact region, but also serves in its entirety as a current distribution layer during the electrochemical formation of bumps, such as solder bumps. Consequently, since the bump structure provided by the present invention lacks any terminal metal layers, such as an aluminum layer and a corresponding adhesion/barrier layer, current drive capability as well as the thermal conductivity may significantly be enhanced, thereby providing the possibility of further reducing the lateral dimensions of the bump structure and/or operating the device under sophisticated operating conditions due to the enhanced heat dissipation and current drive capabilities. Moreover, disadvantageous effects, such as aluminum pitting and delamination of passivation layers, especially caused by open regions and wafer scribe lanes, may significantly be reduced due to the enhanced adhesion of the last passivation layer to the underlying metallization layer stack. Moreover, the overall process flow for forming a highly efficient bump structure is significantly reduced in terms of complexity and materials so that remarkable cost savings may be achieved. In addition, the possibility of generally reducing the size of solder bumps, the formation of which may, in sophisticated applications, require the provision of highly expensive radiation reduced lead, may also contribute to a significant reduction in production costs. In addition, the omission of complex aluminum deposition and patterning processes may result in reduced cycle time.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
 a metallization layer comprising a copper-based contact region disposed in a dielectric layer and laterally bordered by a passivation layer formed above said dielectric layer and having a copper-containing contact surface exposed through an opening defined in said passivation layer;
 a last passivation layer formed above said passivation layer and exposing at least a portion of said copper-containing contact surface;
 a copper protection layer located between said passivation layer and said last passivation layer;
 an underbump metallization layer formed on said copper-containing contact surface and a portion of said last passivation layer; and
 a solder bump formed on said underbump metallization layer.

2. The semiconductor device of claim 1, wherein said underbump metallization layer is substantially free of aluminum.

3. The semiconductor device of claim 2, wherein said underbump metallization layer is formed on a portion of said passivation layer and a portion of said last passivation layer.

4. A method, comprising:
 forming a first passivation layer above an exposed copper-containing surface of a contact region;
 forming a first passivation layer above said contact region;
 patterning said first passivation layer to expose said copper-containing surface;
 forming a copper protection layer above said patterned first passivation layer;
 forming a last passivation layer above said copper protection layer;
 patterning said last passivation layer and said copper protection layer to expose a portion of said copper-containing surface, wherein said first passivation layer is patterned prior to forming said last passivation layer;
 forming an underbump metallization layer above said last passivation layer;
 forming a bump on said underbump metallization layer above said copper-containing surface; and
 patterning said underbump metallization layer in the presence of said bump.

5. The method of claim 4, wherein said portion of said copper-containing surface is exposed in situ with forming said underbump metallization layer.

6. The method of claim 5, wherein at least a sub-layer of said underbump metallization layer is formed by sputter deposition process and said portion of said copper-containing surface is exposed during a pre-cleaning step of said sputter deposition process.

* * * * *